US009574744B2

(12) United States Patent
Hyun

(10) Patent No.: US 9,574,744 B2
(45) Date of Patent: Feb. 21, 2017

(54) OPTICAL MEMBER, DISPLAY DEVICE AND LIGHT EMITTING DEVICE HAVING THE SAME

(75) Inventor: Soon Young Hyun, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 125 days.

(21) Appl. No.: 14/235,329

(22) PCT Filed: Jun. 28, 2012

(86) PCT No.: PCT/KR2012/005122
§ 371 (c)(1),
(2), (4) Date: Jan. 27, 2014

(87) PCT Pub. No.: WO2013/015532
PCT Pub. Date: Jan. 31, 2013

(65) Prior Publication Data
US 2014/0160727 A1 Jun. 12, 2014

(30) Foreign Application Priority Data

Jul. 27, 2011 (KR) .................. 10-2011-0074738

(51) Int. Cl.
*F21V 9/16* (2006.01)
*C09K 11/02* (2006.01)
*C09K 11/56* (2006.01)
*C09K 11/88* (2006.01)
*F21V 8/00* (2006.01)
(Continued)

(52) U.S. Cl.
CPC .............. *F21V 9/16* (2013.01); *C09K 11/025* (2013.01); *C09K 11/565* (2013.01); *C09K 11/883* (2013.01); *G02B 6/0023* (2013.01); *G02F 2001/133614* (2013.01); *H01L 33/504* (2013.01); *H01L 33/507* (2013.01); *H01L 2224/48091* (2013.01); *H01L 2924/12044* (2013.01)

(58) Field of Classification Search
CPC ..................... F21K 9/56; C09K 11/00–11/897; G02B 6/0023; G02B 6/0026; G02F 1/133615; F21V 9/16
USPC ......................................................... 362/84
See application file for complete search history.

(56) References Cited

U.S. PATENT DOCUMENTS

| 7,888,700 B2 | 2/2011 | Kahen |
| 9,268,080 B2* | 2/2016 | Lee ....................... G02B 6/0011 |
| 2006/0103589 A1* | 5/2006 | Chua et al. .................... 345/3.1 |

(Continued)

FOREIGN PATENT DOCUMENTS

| TW | 2009-12478 A | 3/2009 |
| TW | 2009-52206 A | 12/2009 |

(Continued)

OTHER PUBLICATIONS

European Search Report dated Sep. 24, 2014 in European Application No. 20120817716.

(Continued)

*Primary Examiner* — Sean Gramling
(74) *Attorney, Agent, or Firm* — Saliwanchik, Lloyd & Eisenschenk

(57) ABSTRACT

Disclosed are an optical member and a liquid crystal display. The optical member includes a host; a plurality of wavelength conversion particles in the host; and a plurality of electron receiving particles adjacent to the wavelength conversion particles, respectively.

14 Claims, 7 Drawing Sheets

(51) Int. Cl.
  *G02F 1/1335* (2006.01)
  *H01L 33/50* (2010.01)

(56) References Cited

U.S. PATENT DOCUMENTS

| | | | |
|---|---|---|---|
| 2008/0198573 A1* | 8/2008 | Justel et al. | 362/84 |
| 2009/0262516 A1* | 10/2009 | Li | 362/84 |
| 2010/0053931 A1* | 3/2010 | Carroll | C09K 11/08 362/84 |
| 2010/0103648 A1* | 4/2010 | Kim | H01L 33/507 362/97.1 |
| 2010/0272192 A1 | 10/2010 | Varadarajan et al. | |
| 2010/0283072 A1 | 11/2010 | Kazlas et al. | |
| 2011/0084250 A1* | 4/2011 | Jang | B82Y 10/00 257/14 |
| 2011/0157865 A1* | 6/2011 | Takahashi et al. | 362/84 |

FOREIGN PATENT DOCUMENTS

| | | |
|---|---|---|
| WO | WO-2009/011922 A1 | 1/2009 |
| WO | WO-2009/137053 A1 | 11/2009 |

OTHER PUBLICATIONS

Office Action dated Sep. 25, 2014 in Taiwanese Application No. 101124379.
International Search Report in International Application No. PCT/KR2012/005122, filed Jun. 28, 2012.
Fu et al., "Silver-enhanced fluorescence emission of single quantum dot nanocomposites." *Chemical Communications*, 2009, pp. 313-315.
Medintz et al., "Interactions between Redox Complexes and Semiconductor Quantum Dots Coupled via a Peptide Bridge." *Journal of American Chemical Society*, 2008, vol. 130, pp. 16745-16756.

* cited by examiner

OPTICAL MEMBER, DISPLAY DEVICE AND LIGHT EMITTING DEVICE HAVING THE SAME

CROSS-REFERENCE TO RELATED APPLICATIONS

This application is the U.S. national stage application of International Patent Application No. PCT/KR2012/005122, filed Jun. 28, 2012, which claims priority to Korean Application No. 10-2011-0074738, filed Jul. 27, 2011, the disclosures of each of which are incorporated herein by reference in their entirety.

TECHNICAL FIELD

The embodiment relates to an optical member, a display device and a light emitting device having the same.

BACKGROUND ART

Recently, flat display devices, such as an LCD (liquid crystal display), a PDA (plasma display panel) or an OLED (organic light emitting diode), have been increasingly developed instead of conventional CRTs (cathode ray tubes).

Among them, the LCD includes a liquid crystal display panel having a thin film transistor substrate, a color filter substrate and a liquid crystal injected between the thin film transistor substrate and the color filter substrate. Since the liquid crystal display panel is a non-emissive device, a backlight unit is provided below the thin film transistor substrate to supply light. Transmittance of the light emitted from the backlight unit is adjusted according to the alignment state of the liquid crystal.

The backlight unit is classified into an edge-illumination type backlight unit and a direct-illumination type backlight unit according to the position of a light source. According to the edge-illumination type backlight unit, the light source is located at a lateral side of a light guide plate.

The direct-illumination type backlight unit has been developed as the size of the LCD has become enlarged. According to the direct-illumination type backlight unit, at least one light source is located below the liquid crystal display panel to supply the light over the whole area of the liquid crystal display panel.

When comparing with the edge-illumination type backlight unit, the direct-illumination type backlight unit can employ a large number of light sources so that the high brightness can be achieved. In contrast, the direct-illumination type backlight unit must have thickness larger than thickness of the edge-illumination type backlight unit in order to ensure brightness uniformity.

In order to solve the above problem, a quantum dot bar having a plurality of quantum dots, which can convert blue light into red light or green light, is positioned in front of a blue LED that emits the blue light. Thus, as the blue light is irradiated onto the quantum dot bar, the blue light, the red light and the green light are mixed and the mixed light is incident into the light guide plate, thereby generating white light.

If the white light is supplied to the light guide plate by using the quantum dot bar, high color reproduction may be realized.

The backlight unit may include an FPCB (flexible printed circuit board) provided at one side of the blue LED to supply signals and power to the LEDs and a bonding member formed under the bottom surface of the FPCB.

The display device, which is capable of displaying various images using the white light supplied to the light guide plate through the quantum dot bar as the blue light is emitted from the blue LED, has been extensively used.

A display device employing such a quantum dot is disclosed in Korean Unexamined Patent Publication No. 10-2011-006810.

DISCLOSURE OF INVENTION

Technical Problem

The embodiment provides an optical member having improved optical characteristics, a display device and a light emitting device having the same.

Solution to Problem

An optical member according to the embodiment includes a host; a plurality of wavelength conversion particles in the host; and a plurality of electron receiving particles adjacent to the wavelength conversion particles, respectively.

An optical member according to the embodiment includes a host; and a plurality of wavelength conversion complexes, wherein each wavelength conversion complex includes a wavelength conversion particle; a ligand connected to the wavelength conversion particle; and an electron receiving particle connected to the ligand.

A display device according to the embodiment includes a light source; a host; a wavelength conversion member into which light is incident from the light source; and a display panel into which the light is incident from the wavelength conversion member, wherein the wavelength conversion member includes a host; a plurality of wavelength conversion particles in the host; and a plurality of electron receiving particles adjacent to the wavelength conversion particles, respectively.

A light emitting device according to the embodiment includes a light emitting part; and an optical member disposed in a path of light emitted from the light emitting part, wherein the optical member includes a host; a plurality of wavelength conversion particles in the host; and a plurality of electron receiving particles adjacent to the wavelength conversion particles, respectively.

Advantageous Effects of Invention

The optical member, the display device and the light emitting device according to the embodiment include the electron receiving particles adjacent to the wavelength conversion particles, respectively. In addition, some of electrons, which are generated as the light is incident into the wavelength conversion particles, are temporally received in the electron receiving particles and then supplied again to the wavelength conversion particles. Thus, the light conversion particles may emit the light by the supplied electrons.

Therefore, the optical member, the display device and the light emitting device according to the embodiment can maximize the photo electromagnetic effect and can improve the light efficiency. In addition, the excited light goes to the ground state through various steps due to the incident light.

The optical member, the display device and the light emitting device according to the embodiment can improve the color reproduction rate and may increase continuity of color reproduction. Thus, color coordinate variation can be reduced. Accordingly, the optical member, the display device and the light emitting device according to the embodiment can improve the light conversion efficiency and light characteristics.

MODE FOR THE INVENTION

Figure 1:
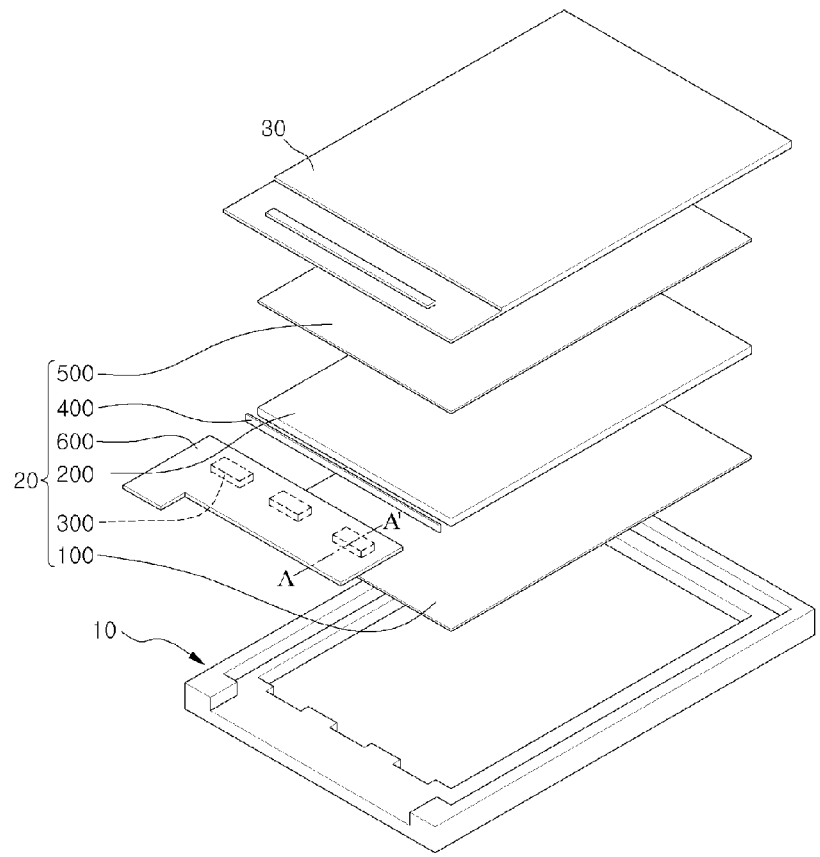
FIG. 1 is an exploded perspective view showing a liquid crystal display according to the first embodiment.

In the description of the embodiments, it will be understood that, when a substrate, a frame, a sheet, a layer, or a pattern is referred to as being "on" or "under" another substrate, another frame, another sheet, another layer, or another pattern, it can be "directly" or "indirectly" on the other substrate, the other frame, the other sheet, the other layer, or the other pattern, or one or more intervening layers may also be present. Such a position of each component has been described with reference to the drawings. The thickness and size of each component shown in the drawings may be exaggerated, omitted or schematically drawn for the purpose of convenience or clarity. In addition, the size of elements does not utterly reflect an actual size.

Figure 2:
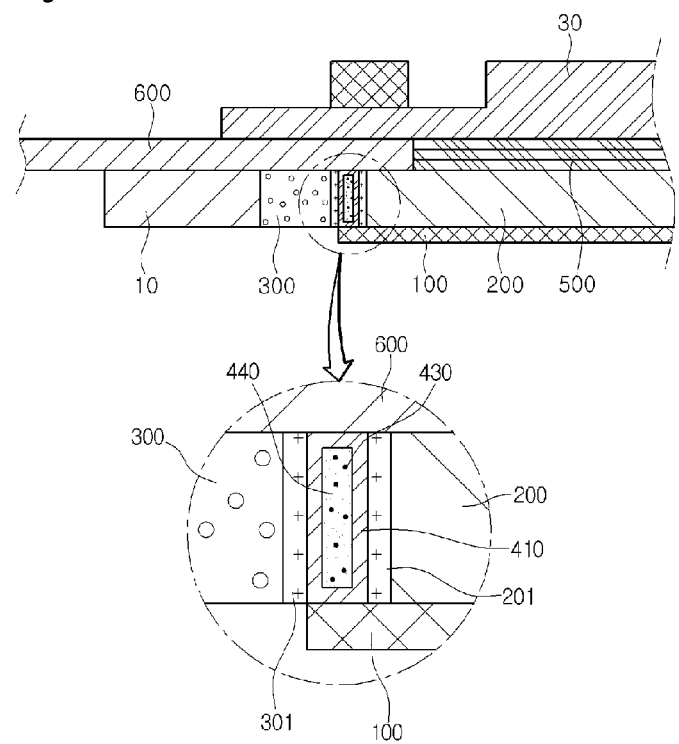
FIG. 2 is a sectional view taken along line A-A' of FIG. 1.
Figure 3:
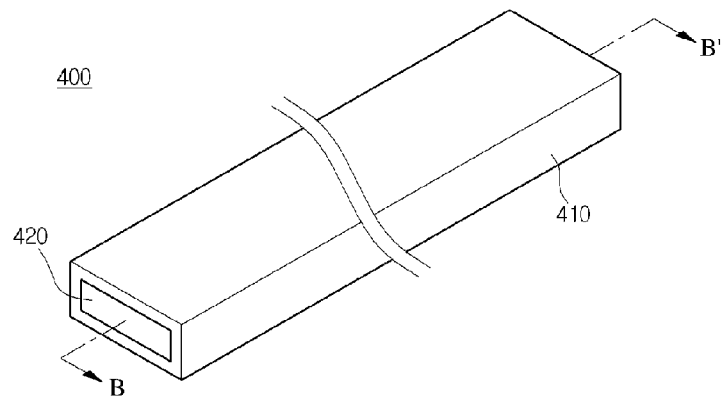
FIG. 3 is a perspective view showing a wavelength conversion member according to the embodiment.
Figure 4:
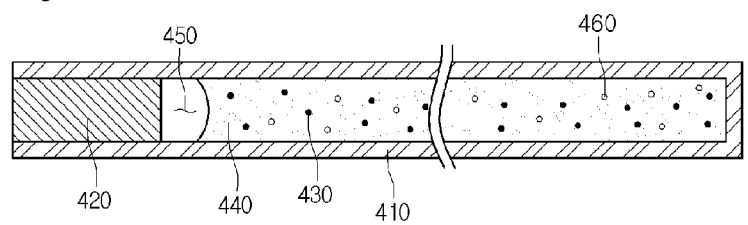
FIG. 4 is a sectional view taken along line B-B' of FIG. 3.
Figure 5:
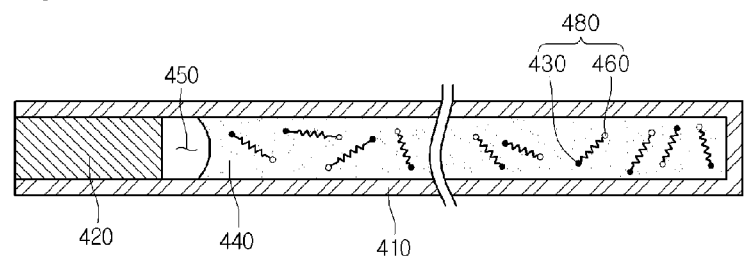
FIG. 5 is a sectional view showing a wavelength conversion member according to another embodiment.
Figure 6:
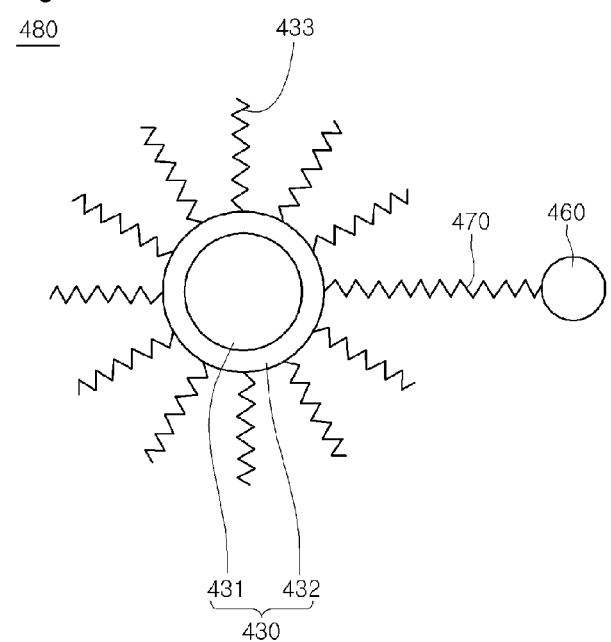
FIG. 6 is a view showing a wavelength conversion complex.
Figure 7:
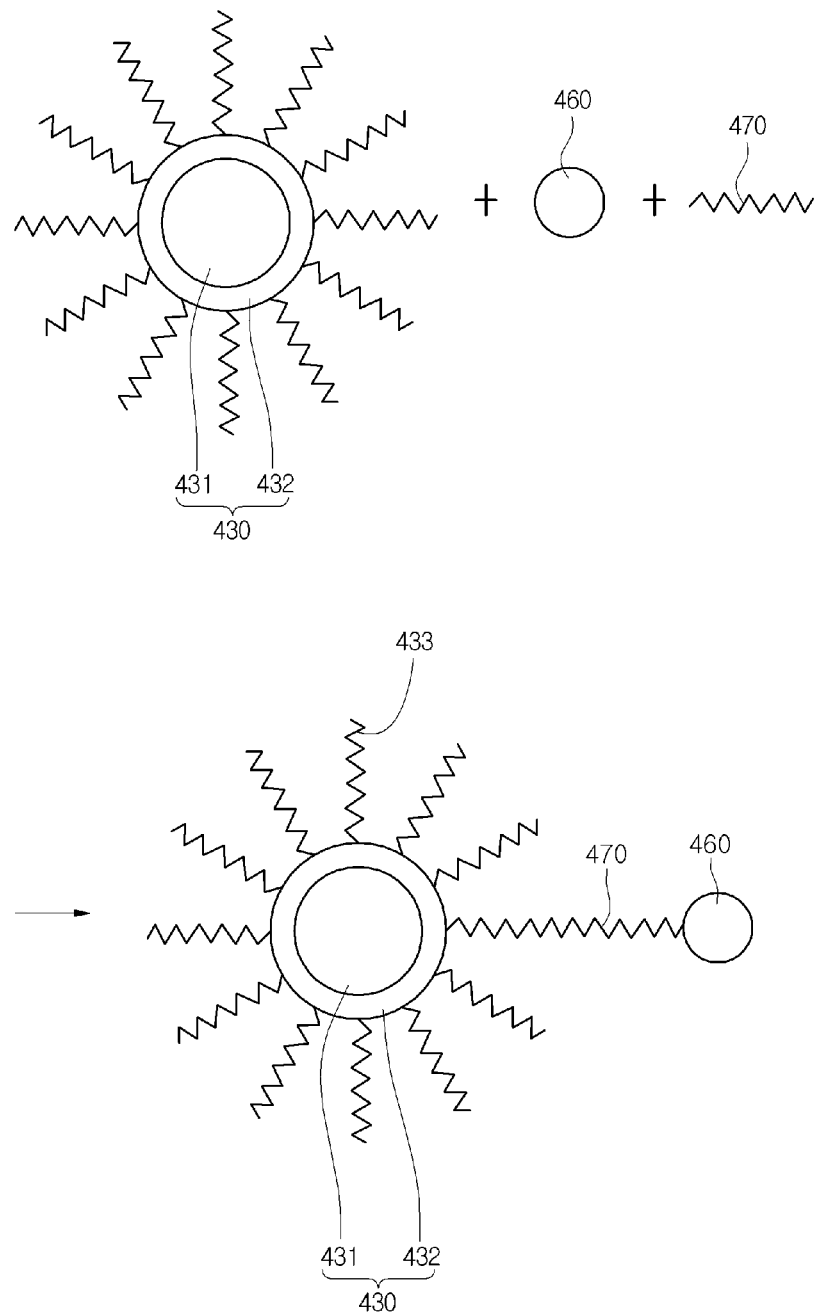
FIG. 7 is a view showing the procedure for fabricating a wavelength conversion complex.
Figure 8:
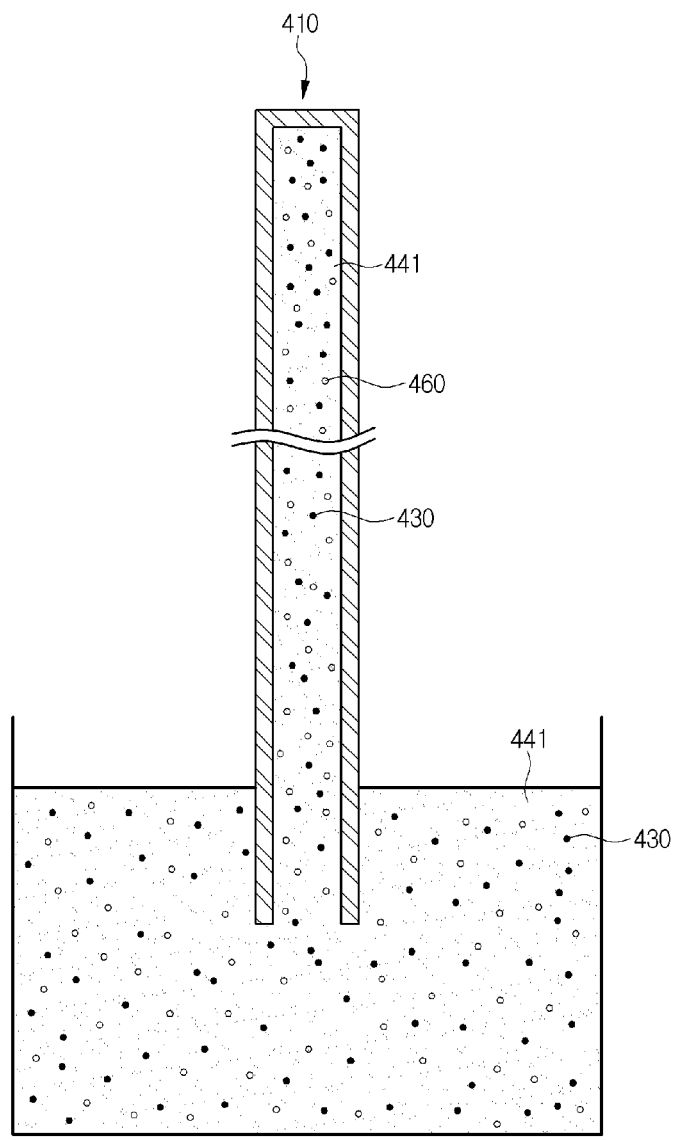
FIGS. 8 to 10 are sectional views showing the method for fabricating a wavelength conversion member according to the embodiment.
Figure 9:
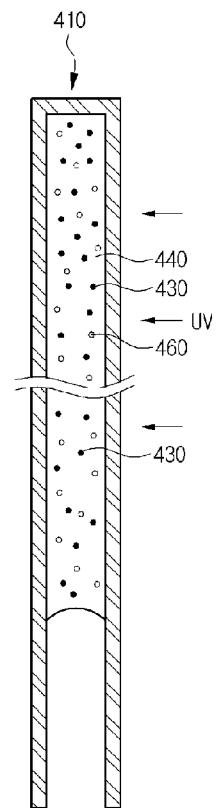
Figure 10:
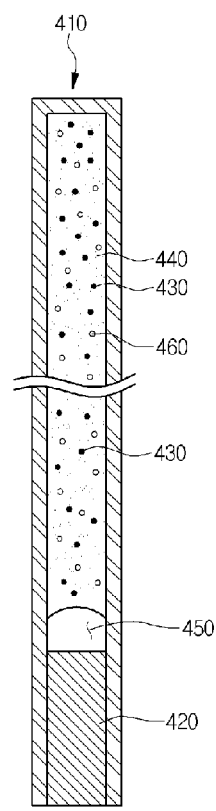

FIG. 1 is an exploded perspective view showing a liquid crystal display according to the first embodiment, FIG. 2 is a sectional view taken along line A-A' of FIG. 1, FIG. 3 is a perspective view showing a wavelength conversion member according to the embodiment, FIG. 4 is a sectional view taken along line B-B' of FIG. 3, FIG. 5 is a sectional view showing a wavelength conversion member according to another embodiment, FIG. 6 is a view showing a wavelength conversion complex, FIG. 7 is a view showing the procedure for fabricating the wavelength conversion complex, and FIGS. 8 to 10 are sectional views showing the method for fabricating a wavelength conversion member according to the embodiment.

Referring to FIGS. 1 to 4, a liquid crystal display according to the embodiment includes a mold frame 10, a backlight assembly 20, and a liquid crystal panel 30.

The mold frame 10 receives the backlight assembly 20 and the liquid crystal panel 30 therein. The mold frame 10 has a rectangular frame shape, and a material used for the mold frame 10 may include plastic or reinforced plastic.

In addition, a chassis may be disposed below the mold frame 10 to surround the mold frame 10 and support the backlight assembly 20. The chassis may also be disposed at a lateral side of the mold frame 10.

The backlight assembly 20 is disposed in the mold frame 10 to supply the light toward the liquid crystal panel 30 by generating the light. The backlight assembly 20 includes a reflective sheet 100, a light guide plate 200, light emitting diodes 300, a wavelength conversion member 400, a plurality of optical sheets 500, and a flexible printed circuit board (FPCB) 600.

The reflective sheet 100 reflects the light upward as the light is emitted from the light emitting diodes 300.

The light guide plate 200 is disposed on the reflective sheet 100 to reflect the light upward by totally reflecting, refracting and scattering the light incident thereto from the light emitting diodes 300.

The light guide plate 200 includes an incident surface directed toward the light emitting diodes 300. From among lateral sides of the light guide plate 200, a lateral side directed toward the light emitting diodes 300 may serve as the incident surface.

The light emitting diodes 300 are disposed at the lateral side of the light guide plate 200. In detail, the light emitting diodes 300 are disposed at the incident surface.

The light emitting diodes 300 serve as a light source for generating the light. In detail, the light emitting diodes 300 emit the light toward the wavelength conversion member 400.

The light emitting diodes 300 may include a blue light emitting diode generating blue light or a UV light emitting diode generating UV light. That is, the light emitting diodes 300 may generate the blue light having the wavelength band of about 430 nm to about 470 nm or the UV light having the wavelength band of about 300 nm to about 400 nm.

The light emitting diodes 300 are mounted on the FPCB 600. The light emitting diodes 300 are disposed under the FPCB 600. The light emitting diodes 300 are driven by receiving a driving signal through the FPCB 600.

The wavelength conversion member 400 is interposed between the light emitting diodes 300 and the light guide plate 200. In detail, the wavelength conversion member 400 is bonded to the lateral side of the light guide plate 200. In more detail, the wavelength conversion member 400 is attached to the incident surface of the light guide plate 200. In addition, the wavelength conversion member 400 can be bonded to the light emitting diodes 300.

The wavelength conversion member 400 receives the light from the light emitting diodes 300 to convert the wavelength of the light. For instance, the wavelength conversion member 400 can convert the blue light emitted from the light emitting diodes 300 into green light and red light. In detail, the wavelength conversion member 400 converts a part of the blue light into the green light having the wavelength in the range of about 520 nm to about 560 nm, and converts a part of the blue light into the red light having the wavelength in the range of about 630 nm to about 660 nm.

In addition, the wavelength conversion member 400 can convert the UV light emitted from the light emitting diodes 300 into the blue light, green light and red light. In detail, the wavelength conversion member 400 converts a part of the UV light into the blue light having the wavelength in the range of about 430 nm to about 470 nm, converts a part of the UV light into the green light having the wavelength in the range of about 520 nm to about 560 nm, and converts a part of the UV light into the red light having the wavelength in the range of about 630 nm to about 660 nm.

Thus, white light can be generated by the light passing through the wavelength conversion member 400 and the lights converted by the wavelength conversion member 400. That is, the white light is incident into the light guide plate 200 through the combination of the blue light, green light and red light.

As shown in FIGS. 3 and 4, the wavelength conversion member 400 includes a tube 410, a sealing part 420, a plurality of wavelength conversion particles 430, a plurality of electron receiving particles 460 and a host 440. In addition, the wavelength conversion member 400 may further include a dispersing agent.

The tube 410 receives the sealing part 420, the wavelength conversion particles 430 and the host 440 therein. That is, the tube 410 may serve as a receptacle to receive the sealing part 420, the wavelength conversion particles 430 and the host 440. In addition, the tube 410 extends with a long length in one direction.

The tube 410 may have a rectangular pipe shape. In detail, a section of the tube 410, which is vertical to the length direction of the tube 410, may have a rectangular shape. In addition, the section of the tube 410, which is vertical to the length direction of the tube 410 may have a width of about 0.6 mm and a height of about 0.2 mm. That is, the tube 410 may include a capillary tube.

The tube 410 is transparent. The tube 410 may include glass. In detail, the tube 410 may include a glass capillary tube.

The sealing part 420 is disposed in the tube 410. The sealing part 420 is arranged at an end of the tube 410 to seal the tube 410. The sealing part 420 may include epoxy resin.

The wavelength conversion particles 430 are provided in the tube 410. In detail, the wavelength conversion particles 430 are uniformly distributed in the host 440 installed in the tube 410.

The wavelength conversion particles 430 convert the wavelength of the light emitted from the light emitting diodes 300. In detail, the light is incident into the wavelength conversion particles 430 from the light emitting diode 300 and the wavelength conversion particles 430 convert the wavelength of the incident light. For instance, the wavelength conversion particles 430 can convert the blue light emitted from the light emitting diodes 300 into the green light and the red light. That is, a part of the wavelength conversion particles 430 converts the blue light into the green light having the wavelength in the range of about 520 nm to about 560 nm and a part of the wavelength conversion particles 430 converts the blue light into the red light having the wavelength in the range of about 630 nm to about 660 nm.

In addition, the wavelength conversion particles 430 can convert the UV light emitted from the light emitting diodes 300 into the blue light, the green light and the red light. That is, a part of the wavelength conversion particles 430 converts the UV light into the blue light having the wavelength in the range of about 430 nm to about 470 nm, and a part of the wavelength conversion particles 430 converts the UV light into the green light having the wavelength in the range of about 520 nm to about 560 nm. Further, a part of the wavelength conversion particles 430 converts the UV light into the red light having the wavelength in the range of about 630 nm to about 660 nm.

In other words, if the light emitting diode 300 is a blue light emitting diode that emits the blue light, the wavelength conversion particles 430 capable of converting the blue light into the green light and the red light may be employed. In addition, if the light emitting diode 300 is a UV light emitting diode that emits the UV light, the wavelength conversion particles 430 capable of converting the UV light into the blue light, the green light and the red light may be employed.

The wavelength conversion particles 430 may have a diameter in the range of about 1 nm to about 10 nm. That is, the wavelength conversion particles 430 may include nano particles.

The wavelength conversion particles 430 may include quantum dots. The quantum dots may include core nano-crystals 431 and shell nano-crystals 432 surrounding the core nano-crystals.

The shell nano-crystals 432 may be prepared as at least two layers. The shell nano-crystals are formed on the surface of the core nano-crystals 431. The quantum dots can lengthen the wavelength of the light incident into the core nano-crystals 431 by using the shell nano-crystals 432 forming a shell layer, thereby improving the light efficiency.

The quantum dots may include at least one of a group-II compound semiconductor, a group-III compound semiconductor, a group-V compound semiconductor, and a group-VI compound semiconductor. In more detail, the core nano-crystals 431 may include CdSe, InGaP, CdTe, CdS, ZnSe, ZnTe, ZnS, HgTe or HgS. In addition, the shell nano-crystals may include CuZnS, CdSe, CdTe, CdS, ZnSe, ZnTe, ZnS, HgTe or HgS.

The wavelength of the light emitted from the quantum dots can be adjusted according to the size of the quantum dot.

In particular, if the size of the quantum dot is smaller than the Bohr radius of an exciton, which consists of an electron and a hole excited by light and electricity, the quantum confinement effect may occur, so that the quantum dot may have the discrete energy level. Thus, the size of the energy gap is changed. In addition, the charges are confined within the quantum dot, so that the light emitting efficiency can be improved.

Different from general fluorescent pigments, the fluorescent wavelength of the quantum dot may vary depending on the size of the particles. In detail, the light has the shorter wavelength as the size of the particle becomes small, so the fluorescent light having the wavelength band of visible ray can be generated by adjusting the size of the particles. In addition, the quantum dot represents the extinction coefficient, which is 100 to 1000 times higher than that of the general fluorescent pigment, and has the superior quantum yield as compared with the general fluorescent pigment, so that the strong fluorescent light can be generated.

The quantum dots can be synthesized through the chemical wet scheme. The chemical wet scheme is to grow the particles by immersing the precursor material in the organic solvent. According to the chemical wet scheme, the quantum dots can be synthesized.

In order to stabilize the quantum dot, stabilizing ligands are bonded with the quantum dots. In detail, one end of the stabilizing ligand is bonded with the quantum dot. In addition, the stabilizing ligands surround the quantum dots. In more detail, one end of the stabilizing ligand is bonded to the outer surface of the quantum dot to surround the quantum dot.

The stabilizing ligands stabilize the unstable quantum dots after the synthesis process. Dangling bonds may be formed at the valence band after the synthesis process and the quantum dots may be unstable due to the dangling bonds. However, one end of the stabilizing ligand is the nonbonding state and this one end is bonded with the dangling bond, so that the quantum dots can be stabilized.

The stabilizing ligand may include pyridine, mercapto alcohol, thiol, phosphine, and phosphine oxide. In addition, the stabilizing ligand may include polyethylene imine, 3-amino propyltrimethoxy silane, mercaptoacetic acid, 3-mercaptopropyl trimethoxy silane, or 3-mercaptopropionic acid. Further, various types of hydrophilic organic ligands can be used as the stabilizing ligand.

The electron receiving particles 460 are disposed in the host 440. The electron receiving particles 460 are located adjacent to the wavelength conversion particles 430, respectively. In detail, the electron receiving particles 460 may be adjacent to the wavelength conversion particles 430. That is, the electron receiving particles 460 are adjacent to the wavelength conversion particles 430, and simultaneously, the wavelength conversion particles 430 are adjacent to the electron receiving particles 460. In addition, the electron receiving particles 460 are disposed around the wavelength conversion particles 430.

A distance between each wavelength conversion particle 430 and each electron receiving particle 460 is in the range of about 10 nm to about 50 nm.

The electron receiving particles 460 are conductors. In detail, the electron receiving particles 460 may include metals. That is, the electron receiving particles 460 may include metallic particles. For instance, the electron receiving particles 460 may include gold, silver or aluminum.

The electron receiving particles 460 may have a diameter in the range of about 1 nm to about 10 nm. That is, the electron receiving particles 460 may include nano particles.

The ratio of the wavelength conversion particles 430 to the electron receiving particles 460 in number is in the range of about 4:1 to about 1:4. In detail, the number of the wavelength conversion particles 430 is substantially equal to the number of the electron receiving particles 460.

Since the electron receiving particles 460 are conductors, the electron receiving particles 460 can temporally receive some of the electrons generated from the wavelength conversion particles 430. In particular, if the distance between the electron receiving particles 460 and the wavelength conversion particles 430 is in the range of about 10 nm to about 50 nm, the electron receiving particles 460 may receive or transmit electrons from or to the wavelength conversion particles 430.

The host 440 surrounds the wavelength conversion particles 430. In detail, the wavelength conversion particles 430 are uniformly distributed in the host 440. The host 440 includes polymer. The host 440 is transparent. That is, the host 440 includes transparent polymer.

The host 440 is disposed in the tube 410. In detail, the host 440 is fully filled in the tube 410. The host 440 may adhere to an inner surface of the tube 410.

An air layer 450 is formed between the sealing part 450 and the host 440. The air layer 450 is filled with nitrogen. The air layer 450 serves as a buffer between the sealing part 420 and the host 440.

In addition, the dispersing agent may be added to the host 440. The dispersing agent is disposed in the host 440. The dispersing agent uniformly disperses the wavelength conversion particles 430 in the host 440 when the wavelength conversion particles 430 are fabricated.

For instance, the dispersing agent includes a silicon oil dispersing agent, sodium dodecyl benzene sulfonate, disodium ethoxylate nonyl phenol half ester sulfosuccinate, or dioctyl ester sodium sulfosuccinate.

As shown in FIGS. 5 and 6, the wavelength conversion member 400 may include the wavelength conversion particles 430 and the electron receiving particles 460 as wavelength conversion complexes 480. That is, the wavelength conversion member 400 may include a plurality of wavelength conversion complexes 480.

The wavelength conversion complexes 480 include the wavelength conversion particles 430, the electron receiving particles 460 and bridging ligands 470.

The wavelength conversion particles 430 are interlinked with the electron receiving particles 460. In detail, the wavelength conversion particles 430 are linked with the electron receiving particles 460 by the bridging ligands 470. One ends of the bridging ligands 470 are bonded to the wavelength conversion particles 430 and other ends of the bridging ligands 470 are bonded to the electron receiving particles 460. The bridging ligands 470 are organic substances having a predetermined length sufficient for spacing the wavelength conversion particles 430 from electron receiving particles 460 by a desired distance. For instance, the bridging ligands 470 may have a length in the range of about 10 nm to about 50 nm.

For instance, the bridging ligands 470 may include pyridine, mercapto alcohol, thiol, phosphine, phosphine oxide, polyethylene imine, 3-amino propyltrimethoxy silane, mercaptoacetic acid, 3-mercaptopropyl trimethoxy silane, or 3-mercaptopropionic acid.

The bridging ligands 470 may be bonded with the stabilizing ligands 433 to stabilize the quantum dots. In detail, the bridging ligands 470 may be chemically bonded with the stabilizing ligands 433. For instance, the bridging ligands 470 may be bonded with the stabilizing ligands 433 through the condensation, such as the polycondensation. In addition, the bridging ligands 470 may be directly bonded with the wavelength conversion particles 430.

Referring to FIG. 7, the wavelength conversion complex 480 can be prepared through the following method.

First, the core nano-crystals 431 are formed through the wet scheme. That is, crystals are grown through the reaction of precursor materials in the solvent so that the core nano-crystals 431 are formed.

For instance, in order to form CdS core nano-crystals, tri-n-octylphosphine oxide (TOPO), tri-butylphosphine (TBP) and hexadecylamine (HDA) may be used as the surfactant and the solvent.

In addition, cadmium oxide (CdO), cadmium sulfate or cadmium acetate may be used as cadmium oxide precursor material and mercapto ethanol or sodium sulfide ($Na_2S$) may be used as sulfuric precursor material.

In addition, the shell nano-crystals 432 can also be formed through the wet scheme. That is, precursor materials are added to the solution including the core nano-crystals 431 to grow the crystals through the reaction, thereby forming the shell nano-crystals 432.

For instance, in order to form the quantum dot having the CdS/ZnS structure, zinc precursor material and the sulfuric precursor material can be added to the solution including the CdS core nano-crystals 431. Then, the shell nano-crystals 432 are formed through the reaction between the zinc precursor material and the sulfuric precursor material, so that the quantum dot having the CdS/ZnS structure can be formed. The zinc precursor material may include zinc acetate ($Zn(CH_3COO)_2$).

In addition, the quantum dot having the CdSe/ZnS structure can also be formed in a similar way.

Then, a plurality of stabilizing ligands 433 are bonded to the wavelength conversion particles 430, such as the quantum dots. The stabilizing ligands 433 are added to the solution including the quantum dot 431 and the stabilizing ligands 433 are bonded to the quantum dot 431.

For instance, mercapto arsenic acid is added to the solution including the quantum dot having the CdS/ZnS structure or the CdSe/ZnS structure so that the mercapto arsenic acid is bonded with the quantum dot. In detail, the hydroxyl group (—OH) on the ZnS surface is bonded with the carboxyle group (—COOH) of the mercapto arsenic acid through the dehydration reaction. In addition, since Zn atoms are very affinitive to sulfur (S) of the mercapto arsenic acid (MAA), the mercapto arsenic acid can be readily bonded with the quantum dot having the CdS/ZnS structure.

After that, the solution including the electron receiving particles 460 and the bridging ligands 470 is added to the solution including the stabilized quantum dot. For instance, Au nano particles, Ag nano particles or Al nano particles are uniformly distributed in the solvent, such as methyl ethyl ketone (MEK). Then, 3-mercaptopropyl trimethoxy silane is added to the dispersing solution and this mixture solution is subject to the reaction for 8 hours at the temperature in the range of about 50° C. to 80° C., so that the bridging ligands 470 are bonded with the electron receiving particles 460. At this time, the surfactant can be added to the mixture.

After that, the reaction solution including the bridging ligands 470 bonded with the electron receiving particles 460 is added to the solution including the quantum dot and subject to the reaction. For instance, the reaction solution prepared through the above process is added to the solution including the quantum dot and subject to the reaction for 4 hours at the temperature of about 70° C. Then, the solvent is removed at the temperature of about 90° C., so that the wavelength conversion complexes 480 are formed.

The wavelength conversion member 400 may be formed through the following method.

Referring to FIG. 8, the wavelength conversion particles 430 and the electron receiving particles 460 are uniformly distributed in the resin composition including silicon resin. At this time, the number of the wavelength conversion particles 430 and the electron receiving particles 460 may be suitably adjusted in such a manner that the distance between the wavelength conversion particles 430 and the electron receiving particles 460 may be set in the range of about 10 nm to about 50 nm. For instance, the wavelength conversion particles 430 can be distributed in the resin composition with the concentration of about 88 particles/μm2 to about 796 particles/μm2. Similarly, the electron receiving particles 460 may distributed in the resin composition with the concentration of about 88 particles/μm2 to about 796 particles/μm2.

Meanwhile, the wavelength conversion particles 430 and the electron receiving particles 460 may be bonded with each other in the form of the wavelength conversion complexes 480 as shown in FIGS. 5 and 6. The wavelength conversion complexes 480 are uniformly distributed in the resin composition.

Then, the resin composition where the wavelength conversion particles 430 and the electron receiving particles 460 are distributed is introduced into the tube 410.

Referring to FIG. 9, the resin composition introduced into the tube 410 is cured by UV light, so that the host 440 is formed.

Referring to FIG. 10, the epoxy resin composition is introduced into an inlet portion of the tube 410. Then, the epoxy resin composition 441 is cured so that the sealing part 420 is formed. The sealing part 420 is formed in the nitrogen atmosphere so that the air layer 450 including nitrogen is formed between the sealing part 420 and the host 400.

Referring to FIG. 2, the wavelength conversion member 400 is bonded to the light guide plate 200. A first adhesive layer 201 is formed between the wavelength conversion member 400 and the light guide plate 200 and the wavelength conversion member 400 is bonded to the lateral side of the light guide plate 200 through the first adhesive layer 201.

The first adhesive layer 201 is transparent. The first adhesive layer 201 may include an epoxy resin or an acryl resin.

The wavelength conversion member 400 is bonded to the light emitting diodes 300. A second adhesive layer 301 is formed between the wavelength conversion member 400 and the light emitting diodes 300 and the wavelength conversion member 400 is bonded to an exit surface of the light guide plate 200 through the second adhesive layer 301.

The wavelength conversion member 400 adheres to the second adhesive layer 301. In detail, the tube 410 adheres to the second adhesive layer 301. The second adhesive layer 301 is transparent. The second adhesive layer 301 may include an epoxy resin or an acryl resin.

The optical sheets 500 are disposed on the light guide plate 200 to improve the characteristic of the light passing through the optical sheets 500.

The FPCB 600 is electrically connected to the light emitting diodes 300. The FPCB 600 may mount the light emitting diodes 300 thereon. The FPCB 600 is installed in the mold frame 10 and arranged on the light guide plate 200.

The backlight unit is constructed by the mold frame 10 and the backlight assembly 20. In other words, the backlight unit includes the mold frame 10 and the backlight assembly 20.

The liquid crystal panel 30 is provided inside the mold frame 10, and arranged on the optical sheets 500.

The liquid crystal panel 30 displays images by adjusting intensity of the light passing through the liquid crystal panel 30. That is, the liquid crystal panel 30 is a display panel to display the images. The liquid crystal panel 30 includes a TFT substrate, a color filter substrate, a liquid crystal layer interposed between the above two substrates and polarizing filters.

As described above, the wavelength conversion particles 430 and the electron receiving particles 460 are adjacent to each other. At this time, some of electrons, which are generated as the light is incident into the wavelength conversion particles 430, are temporally received in the electron receiving particles 460 and then supplied again to the wavelength conversion particles 430. Thus, the light conversion particles 430 may emit the light by the supplied electrons.

Therefore, the liquid crystal display according to the embodiment can maximize the photo electromagnetic effect and can improve the light efficiency. In addition, the excited light goes to the ground state through various steps due to the incident light.

Thus, the liquid crystal display according to the embodiment can improve the color reproduction rate and may increase continuity of color reproduction. Thus, color coordinate variation can be reduced. Accordingly, the liquid crystal display according to the embodiment can improve the light conversion efficiency and light characteristics.

Hereinafter, the light emitting device according to the embodiment will be described with reference to FIGS. 11 to 13.

Figure 11:
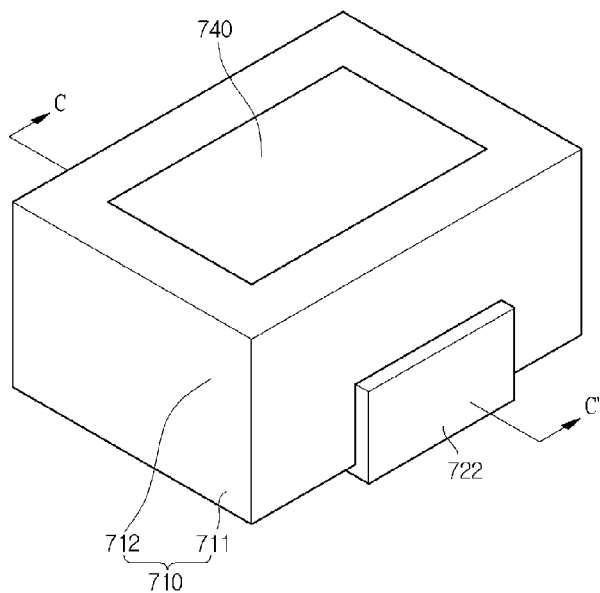
FIG. 11 is a perspective view showing a light emitting device package according to the embodiment.
Figure 12:
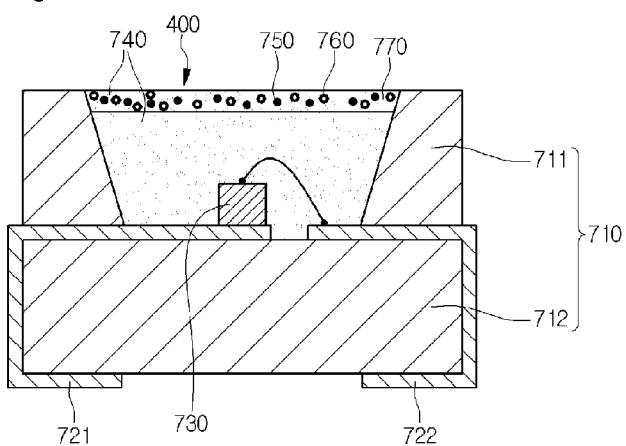
FIG. 12 is a sectional view taken along line C-C' of FIG. 11.
Figure 13:
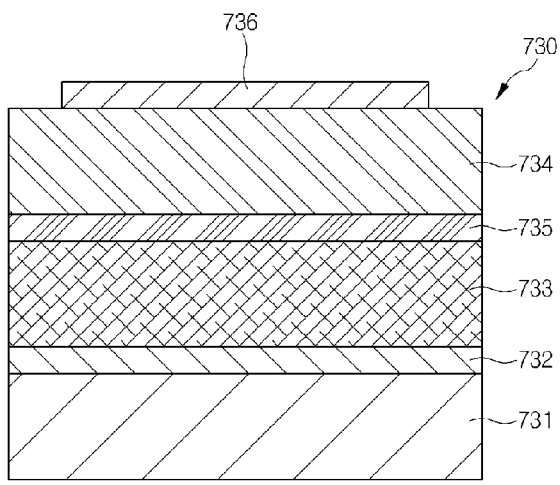
FIG. 13 is a sectional view showing a light emitting diode chip.

FIG. 11 is a perspective view showing a light emitting device package according to the embodiment, FIG. 12 is a sectional view taken along line C-C' of FIG. 11, and FIG. 13 is a sectional view showing a light emitting diode chip. In the description about the light emitting device package according to the embodiment, the previous description about the wavelength conversion member will be incorporated by reference. That is, the previous description of the wavelength conversion member may be incorporated herein by reference except for the modified parts.

Referring to FIGS. 11 to 13, the light emitting device package according to the embodiment includes a body 710, a plurality of lead electrodes 721 and 722, a light emitting part 730, a filling part 740, a plurality of wavelength conversion particles 750 and a plurality of electron receiving particles 760.

The body 710 receives the light emitting part 730, the filling part 740, the wavelength conversion particles 750 and the electron receiving particles 760 therein and supports the lead electrodes 721 and 722.

The body 710 may be formed by using one of a resin material, such as PPA, a ceramic material, liquid crystal polymer (LCP), syndiotactic (SPS), poly phenylene ether (PPS), and a silicon material, but the embodiment is not limited thereto. The body 710 can be integrally formed through the injection molding or can be formed by laminating a plurality of layers.

The body 710 includes a cavity C having an open upper portion. The cavity C can be formed by patterning, punching, cutting or etching the body 710. In addition, the cavity C can be formed by using a metal mold having the structure equal to the structure of the cavity C when the body 710 is formed.

The cavity C may have a cup shape or a concave vessel shape. In addition, the cavity C may have a surface of a circular shape, a polygonal shape or a random shape, but the embodiment is not limited thereto.

The inner wall of the cavity C may be vertical or inclined to the bottom surface of the cavity C by taking the light distribution angle of the light emitting device package into consideration.

The body 710 may include a base part 711 and a receiving part 712.

The base part 711 supports the receiving part 712. In addition, the base part 711 supports the lead electrodes 721 and 722. For instance, the base part 711 may have a rectangular parallelepiped shape.

The receiving part 712 is disposed on the base part 711. The cavity C is defined by the receiving part 712. That is, the cavity is a groove formed in the receiving part 712. The receiving part 712 surrounds the cavity C. When viewed from the top, the receiving part 712 may have a closed loop shape. For instance, the receiving part 712 may have a wall shape surrounding the cavity C.

The receiving part 712 includes a top surface, an outer surface and an inner surface. The Inner surface is an inclined surface, which is inclined with respect to the top surface.

The lead electrodes 721 and 722 can be realized as a lead frame, but the embodiment is not limited thereto.

The lead electrodes 721 and 722 are disposed in the body 710 and installed on the bottom surface of the cavity C while being electrically isolated from each other. Outer portions of the lead electrodes 721 and 722 are exposed out of the body 710.

End portions of the lead electrodes 721 and 722 are located at one lateral side or the other lateral side of the cavity C.

The lead electrodes 721 and 722 can be prepared as lead frames, which can be formed when the body 710 is injection molded. For instance, the lead electrodes 721 and 722 include a first lead electrode 721 and a second lead electrode 722.

The first lead electrode 721 is spaced apart from the second lead electrode 722. In addition, the first lead electrode 721 and the second lead electrode 722 are electrically connected to the light emitting part 730.

The light emitting part 730 includes at least one light emitting diode chip. For instance, the light emitting part 730 may include a blue light emitting diode chip or a UV light emitting diode chip.

The light emitting part 730 may be a lateral type light emitting diode chip or a vertical type light emitting diode chip. As shown in FIG. 6, the light emitting part 730 may include a conductive substrate 731, a light reflective layer 732, a first conductive semiconductor layer 733, a second conductive semiconductor layer 734, an active layer 735 and a second electrode 736.

The conductive substrate 731 consists of a conductor. The conductive substrate 731 supports the light reflective layer 732, the first conductive semiconductor layer 733, the second conductive semiconductor layer 734, the active layer 735 and the second electrode 736.

The conductive substrate 731 is connected to the first conductive semiconductor layer 733 through the light reflective layer 732. That is, the conductive substrate 731 serves as a first electrode for supplying an electric signal to the first conductive semiconductor layer 733.

The light reflective layer 732 is disposed on the conductive substrate 731. The light reflective layer 732 reflects the light emitted from the active layer 735 in the upward direction. In addition, the light reflective layer 732 is a conductive layer. Thus, the light reflective layer 732 connects the conductive substrate 731 to the first conductive semiconductor layer 733. The light reflective layer 732 may be formed by using a metal, such as Ag or Al.

The first conductive semiconductor layer 733 is formed on the light reflective layer 732. The first conductive semiconductor layer 733 has a first conductive type. The first conductive semiconductor layer 733 is an N type semiconductor layer. For instance, the first conductive semiconductor layer 733 is an N type GaN layer.

The second conductive semiconductor layer 734 is formed on the first conductive semiconductor layer 733. The second conductive semiconductor layer 734 is a P type semiconductor layer facing the first conductive semiconductor layer 733. For instance, the second conductive semiconductor layer 734 is a P type GaN layer.

The active layer 735 is interposed between the first conductive semiconductor layer 733 and the second conductive semiconductor layer 734. The active layer 735 may have a single quantum well structure or a multiple quantum wall structure. The active layer 735 may have a periodicity of an InGaN well layer and an AlGaN barrier layer or an InGaN well layer and a GaN barrier layer. The light emitting material for the active layer 735 may vary depending on the light emission wavelengths, such as the blue, red and green wavelengths.

The second electrode 736 is formed on the second conductive semiconductor layer 734. The second electrode 736 is connected to the second conductive semiconductor layer 734.

Meanwhile, the light emitting part 730 may be a lateral type LED. An additional wire may be necessary to connect the lateral type LED to the first lead electrode 721.

The light emitting part 730 is connected to the first lead electrode 721 through a bump and connected to the second lead electrode 722 through a wire. In particular, the light emitting part 730 can be directly formed on the first lead electrode 721.

Besides the above, the light emitting part 730 can be connected to the first and second lead electrodes 721 and 722 through the wire bonding, the die bonding or the flip bonding scheme, but the embodiment is not limited thereto.

The filling part 740 is formed in the cavity C. The filling part 740 is transparent. The filling part 740 may include a material, such as silicon or epoxy, or a material having the refractive index of 2 or less. The filling part 740 covers the light emitting part 730. The filling part 740 may directly make contact with the light emitting part 730.

A reflective layer can be formed on the inner wall of the cavity C. The reflective layer may include a material having high reflective property, such as white PSR (photo solder resist) ink, Ag or Al.

As shown in FIG. 12, the wavelength conversion member 400 is formed on the surface of the filling part 740 in the form of a sheet, that is, in the form of the layered structure. In detail, the solution including the host 770, the wavelength conversion particles 750 and the electron receiving particles 760 is coated on the filling part 740 in a state in which the solvent is not removed, and then the solvent is evaporated. Thus, the wavelength conversion member 400 is formed as the layered structure.

The wavelength conversion particles 750 may convert the blue light emitted from the light emitting part 730 into the green light. In detail, the wavelength conversion particles 750 may convert the blue light emitted from the light emitting part 730 into the light having the wavelength band in the range of about 500 nm to about 590 nm.

In addition, the wavelength conversion particles 750 may convert the blue light emitted from the light emitting part 730 into the green light. In detail, the wavelength conversion particles 750 may convert the blue light emitted from the light emitting part 730 into the light having the wavelength band in the range of about 600 nm to about 700 nm.

Further, when the light emitting part 730 emits the UV light, the wavelength conversion particles 750 may convert the radiant UV light into the blue light.

That is, the wavelength conversion particles 750 receive the light emitted the light emitting part 730 and convert the wavelength of the light. As described above, the wavelength conversion particles 750 can convert the incident blue light into the green light and red light.

In addition, the wavelength conversion particles 750 can convert the UV light emitted from the light emitting part 730 into the blue light, the green light and red light.

The electron receiving particles 760 are disposed in the host 770. The electron receiving particles 760 are located adjacent to the wavelength conversion particles 750, respectively. In detail, the electron receiving particles 760 are adjacent to the wavelength conversion particles 750 with each other. That is, the electron receiving particles 760 are adjacent to the wavelength conversion particles 750, and simultaneously, the wavelength conversion particles 750 are adjacent to the electron receiving particles 760. In addition, the electron receiving particles 760 are disposed around the wavelength conversion particles 750, respectively.

Since the electron receiving particles 760 are conductors, the electron receiving particles 760 can temporally receive some of the electrons generated from the wavelength conversion particles 750. In particular, if the distance between the electron receiving particles 760 and the wavelength conversion particles 750 is in the range of about 10 nm to about 50 nm, the electron receiving particles 760 may receive or transmit electrons from or to the wavelength conversion particles 750.

Thus, the white light can be generated by the light converted by the wavelength conversion particles 750 and the light which is not converted by the wavelength conversion particles 750. That is, the white light can be emitted through the combination of the blue light, green light and red light.

Hereinafter, the lighting device according to the embodiment will be described with reference to FIG. 14.

Figure 14:
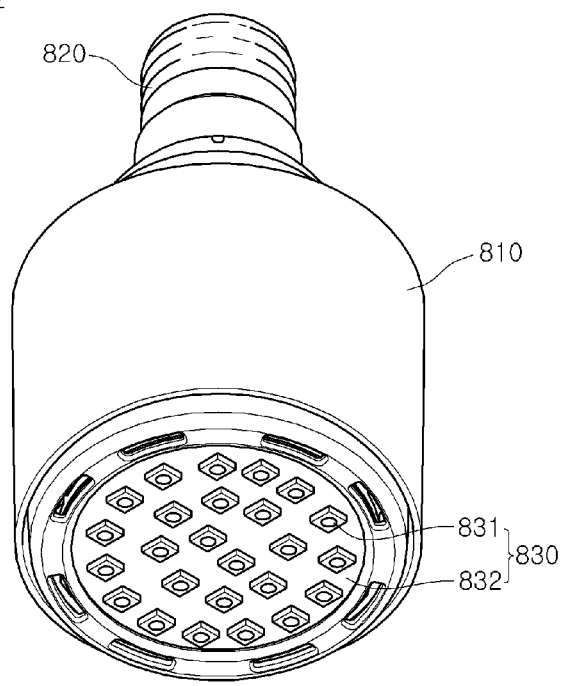
FIG. 14 is a perspective view showing a lighting device according to the embodiment.

FIG. 14 is a perspective view showing the lighting device according to the embodiment. Referring to FIG. 14, the lighting device 800 includes a case 810, a light emitting module 830 installed in the case 810, and a connection terminal 820 installed in the case 810 to receive power from an external power source.

Preferably, the case 810 includes a material having superior heat dissipation property. For instance, the case 810 includes a metallic material or a resin material.

The light emitting module 830 may include a substrate 832 and light emitting device packages 831 according to the embodiment, which are installed on the substrate 832. The light emitting device packages 831 are spaced apart from each other or arranged in the form of a matrix. The light emitting device packages 831 can be basically incorporated with the light emitting device that has been previously described with reference to FIGS. 11 to 13.

The substrate 832 includes an insulating member printed with a circuit pattern. For instance, the substrate 832 includes a PCB (printed circuit board), an MC (metal core) PCB, an FPCB (flexible PCB), a ceramic PCB, and an FR-4 substrate.

In addition, the substrate 832 may include a material that effectively reflects the light. A coating layer can be formed on the surface of the substrate 832. At this time, the coating layer has a white color or a silver color to effectively reflect the light.

At least one light emitting device package 831 is installed on the substrate 832. Each light emitting device package 831 may include at least one LED (light emitting diode) chip. The LED chip may include an LED that emits the light of visible ray band having red, green, blue or white color and a UV (ultraviolet) LED that emits UV light.

The light emitting device packages 831 of the light emitting module 830 can be variously combined to provide various colors and brightness. For instance, the white LED, the red LED and the green LED can be combined to achieve the high color rendering index (CRI).

The connection terminal 820 is electrically connected to the light emitting module 830 to supply power to the light emitting module 830. The connection terminal 820 has a shape of a socket screw-coupled with the external power source, but the embodiment is not limited thereto. For instance, the connection terminal 820 can be prepared in the form of a pin inserted into the external power source or connected to the external power source through a wire.

That is, the optical member and the light emitting device described above can be employed in the lighting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in

The invention claimed is:

1. An optical member comprising:
   a tube;
   a host in the tube;
   a sealing part at an end of the tube;
   an air layer between the sealing part and the host;
   a plurality of wavelength conversion particles in the host;
   a plurality of electron receiving particles adjacent to the wavelength conversion particles, respectively; and
   a plurality of bridging ligands connecting the wavelength conversion particles to the electron receiving particles, respectively;
   wherein the electron receiving particles are disposed in the host;
   wherein ends of the bridging ligands are bonded to a plurality of stabilizing ligands, respectively, of the wavelength conversion particles;
   wherein other ends of the bridging ligands are bonded to the electron receiving particles, respectively,
   wherein a distance between the wavelength conversion particles and the electron receiving particles is in a range of about 10 nm to about 50 nm, and
   wherein the wavelength conversion particles include quantum dots.

2. The optical member of claim 1, wherein the electron receiving particles include metals.

3. The optical member of claim 1, wherein the bridging ligands have a length in a range of about 10 nm to about 50 nm.

4. The optical member of claim 1, wherein the electron receiving particles have a diameter in a range of about 1 nm to about 10 nm.

5. The optical member of claim 1, wherein a ratio of the wavelength conversion particles to the electron receiving particles in number is 4:1 to 1:4.

6. The optical member of claim 1, wherein a ratio of the wavelength conversion particles to the electron receiving particles in number is 1:1.

7. An optical member comprising:
   a tube;
   a host in the tube;
   a sealing part at an end of the tube;
   an air layer between the sealing part and the host; and
   a plurality of wavelength conversion complexes in the host,
   wherein each wavelength conversion complex comprises:
   a wavelength conversion particle;
   a ligand connected to the wavelength conversion particle; and
   an electron receiving particle connected to the ligand;
   wherein the electron receiving particle is disposed in the host,
   wherein one end of the ligand is bonded to a stabilizing ligand of the wavelength conversion particle,
   wherein the other end of the ligand is bonded to the electron receiving particle,
   wherein a distance between the wavelength conversion particle and the electron receiving particle is in a range of about 10 nm to about 50 nm, and
   wherein the wavelength conversion particle includes a quantum dot.

8. The optical member of claim 7, wherein the wavelength conversion particle includes a compound semiconductor and the electron receiving particle includes a metal.

9. The optical member of claim 7, further comprising a dispersing agent added to the host, wherein the dispersing agent includes a silicon oil dispersing agent, sodium dodecyl benzene sulfonate, disodium ethoxylate nonyl phenol half ester sulfosuccinate, or dioctyl ester sodium sulfosuccinate.

10. The optical member of claim 7, wherein the electron receiving particle has a diameter in a range of about 1 nm to about 10 nm.

11. The optical member of claim 7, wherein a ratio of the wavelength conversion particle to the electron receiving particle in number is 4:1 to 1:4.

12. A display device comprising:
   a light guide plate;
   a light source disposed at a lateral side of the light guide plate;
   a wavelength conversion member into which light is incident from the light source;
   a first adhesive layer between the wavelength conversion member and the light guide plate;
   a second adhesive layer between the wavelength conversion member and the light source; and
   a display panel into which the light is incident from the wavelength conversion member,
   wherein the wavelength conversion member comprises:
   a host;
   a plurality of wavelength conversion particles in the host;
   a plurality of electron receiving particles adjacent to the wavelength conversion particles, respectively; and
   a plurality of bridging ligands connecting the wavelength conversion particles to the electron receiving particles, respectively;
   wherein the electron receiving particles are disposed in the host;
   wherein ends of the bridging ligands are bonded to a plurality of stabilizing ligands, respectively, of the wavelength conversion particles;
   wherein other ends of the bridging ligands are bonded to the electron receiving particles, respectively,
   wherein a distance between the wavelength conversion particles and the electron receiving particles is in a range of about 10 nm to about 50 nm,
   wherein the wavelength conversion particles include quantum dots,
   wherein the first adhesive layer is in direct physical contact with the wavelength conversion member and the light guide plate, and
   wherein the second adhesive layer is in direct physical contact with the wavelength conversion member and the light source.

13. The display device of claim 12, wherein the electron receiving particles include Au, Ag or Al.

14. The display device of claim 12, wherein the wavelength conversion member further comprises a tube and a sealing part at an end of the tube,
   wherein the host is disposed in the tube, and
   wherein an air layer is disposed between the sealing part and the host.

\* \* \* \* \*